United States Patent
Kitagawa (10) Patent No.: US 8,767,785 B2
(45) Date of Patent: Jul. 1, 2014

(54) METHOD TO DRIVE SEMICONDUCTOR LASER DIODE AND METHOD TO ASSEMBLE OPTICAL TRANSCEIVER IMPLEMENTED WITH THE SAME

(71) Applicant: Sumitomo Electric Device Innovations, Inc., Yokohama (JP)

(72) Inventor: Kentaro Kitagawa, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 13/863,242

(22) Filed: Apr. 15, 2013

(65) Prior Publication Data

US 2013/0272331 A1 Oct. 17, 2013

(30) Foreign Application Priority Data

Apr. 16, 2012 (JP) .................................. 2012-092998

(51) Int. Cl.
*H01S 3/00* (2006.01)

(52) U.S. Cl.
USPC ................ 372/38.02; 372/38.07; 372/29.015; 372/29.1

(58) Field of Classification Search
USPC ...................... 372/38.02, 38.07, 29.015, 29.1
See application file for complete search history.

(56) References Cited

U.S. PATENT DOCUMENTS

| 6,917,639 B2 * | 7/2005 | Ishida et al. | 372/38.02 |
| 2008/0247429 A1 * | 10/2008 | Colbourne | 372/26 |
| 2010/0265076 A1 * | 10/2010 | Ichino et al. | 340/584 |

FOREIGN PATENT DOCUMENTS

JP 2009-099803 A 5/2009

OTHER PUBLICATIONS

Data sheet of Electronic Components KGL4185KD, 11.3 Gbps Direct Modulation Driver IC, pp. 1/12-12/12, Nov. 13, 2008, LAPIS Semiconductor Co., Ltd.
Data sheet of Electronic Components KGA4185, 11.3 Gbps Direct Modulation Driver IC, pp. 1/11-11/11, Nov. 20, 2008, LAPIS Semiconductor Co., Ltd.

* cited by examiner

*Primary Examiner* — Kinam Park
(74) *Attorney, Agent, or Firm* — Venable LLP; Michael A. Sartori (57) ABSTRACT

A method to operate a semiconductor laser diode (LD) in a differential configuration is disclosed. The method first obtains the threshold current $I_{TH}$ in a bared LD under at least one temperature. Then, a linear relation with coefficients of $\alpha$ and $\beta$ between the bias current $I_B$ and the modulation current $I_M$ independent of temperatures is evaluated by, under the operation of the APC circuit to set the bias current and under the at least one temperature, measuring at least two extinction ratios, $ER_1$ and $ER_2$, as varying the modulation current at two levels, $I_{M1}$ and $I_{M2}$. Two coefficients of $\alpha$ and $\beta$ are estimated by a mathematical comparison.

8 Claims, 7 Drawing Sheets

METHOD TO DRIVE SEMICONDUCTOR LASER DIODE AND METHOD TO ASSEMBLE OPTICAL TRANSCEIVER IMPLEMENTED WITH THE SAME

BACKGROUND OF THE INVENTION

1. Field of the Invention

The present invention relates to a method to drive a semiconductor laser diode (hereafter denoted as LD), and a method to produce an optical transceiver implemented with an LD.

2. Related Background Arts

Two methods to drive an LD have been known in the field, one of which provides a driving signal to one of electrodes of the LD, while the other of which provides signals complementary to each other to respective electrodes of the LD. The former method is further divided in two methods by whether the driving signal is provided to the anode or the cathode. In the latter method, the LD is coupled between two outputs of the differential driver.

SUMMARY OF THE INVENTION

One aspect of the present application relates to a method to drive an LD, which is installed in an apparatus. The LD is driven by a differential driver to be provided with signals complementary to each other to a cathode and an anode thereof differentially. The LD is also supplied with a bias current directly and a modulation current indirectly through the driver. The method has features of: obtaining two parameters that correlate the modulation current with respect to the bias current in a linear equation denoted as:

$$I_M = \alpha \times I_B + \beta,$$

where $I_M$ is the modulation current, $I_B$ is the bias current, and $\alpha$ and $\beta$ are the two parameters; setting the bias current by an auto-power control (APC) such that the apparatus outputs light with a target average power; and determining the modulation current by referring to the two constants.

The differential driver includes a current source to determine a current, a portion of which is converted into the modulation current for the LD. The step to obtain two parameters includes steps of: obtaining a threshold current of the LD from a current-to-light characteristic of the LD not installed in the apparatus; obtaining a basic bias current of the LD so as to set an average power of light output from the apparatus in a target power manually not using the APC; and obtaining a relation between the extinction ratio of the light output from the apparatus and a current determined by the current source in the differential driver. The two parameters are given by:

$$\alpha = c \times M_1/a,$$

$$\beta = D_{M1} - \alpha \times I_{B0},$$

$$a = (M_1 - M_2) \times (c \times I_{B0} - I_{TH})/(D_{M1} - D_{M2}),$$

$$M_N = 2 \times (ER_N - 1)/(ER_N + 1), \text{ and}$$

$$c = I_B/I_{B0};$$

where $ER_N$ and $D_{MN}$ are the extinction ratio and the current provided from the current source, respectively; $I_{TH}$ and $I_{B0}$ are the threshold current and the basic bias current, respectively.

BRIEF DESCRIPTION OF THE DRAWINGS

The foregoing and other purposes, aspects and advantages will be better understood from the following detailed description of a preferred embodiment of the invention with reference to the drawings, in which:

FIG. 3A shows an equivalent circuit of the differential driver when an input signal is in LOW, while.

DESCRIPTION OF PREFERRED EMBODIMENTS

Next, some preferred embodiments of an LD and a method the control an LD according to the present invention will be described as referring to accompanying drawings. In the description of the drawings, numerals or symbols similar to or same with each other will refer to elements similar to or same with each other without overlapping explanations.

Figure 1:
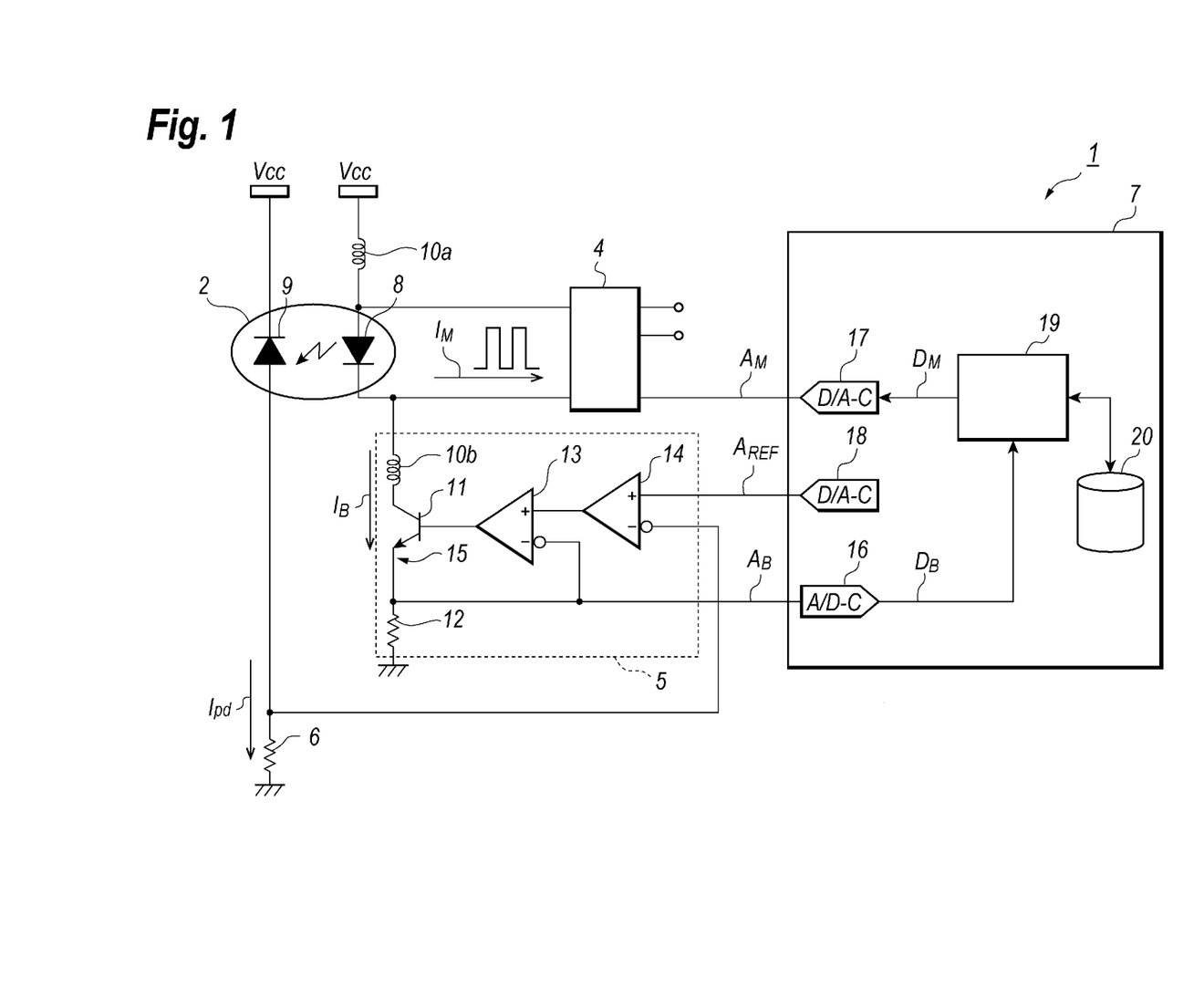
FIG. 1 shows a functional block diagram of an optical transceiver implemented with an LD.
Figure 2:
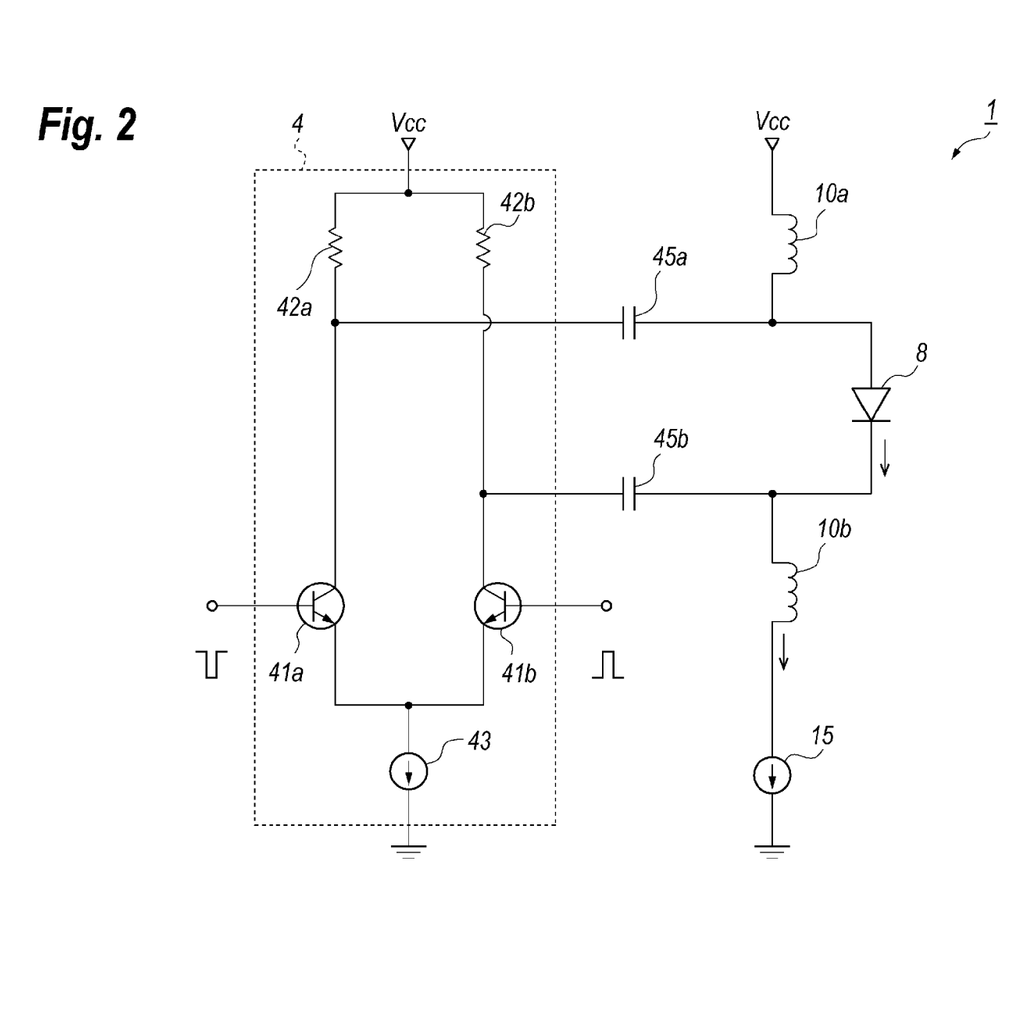
FIG. 2 is a circuit diagram of an LD-Driver 4 with a differential configuration.

FIG. 1 schematically illustrates an optical transceiver implemented with an LD subject to a method for driving it according to the present invention; while, FIG. 2 is a circuit diagram of an LD-Driver 4 with a differential configuration for driving the LD shown in FIG. 1. The optical transceiver 1 shown in FIG. 1, which transmits and receives optical signals, includes an optical sub-assembly (OSA) 2, an LD-driver 4, an auto-power control (APC) circuit 5, a resistor 6, and a controller 7.

The OSA 2 installs the LD 8 and a monitor photodiode 9 (hereafter denoted as mPD). The LD 8 of the present embodiment has an arrangement of, what is called, the edge emitting type with a front facet and a back facet. The front facet emits an optical signal extracted from the optical transceiver 1, while, the mPD 9 monitors light output from the back facet of the LD 8 to monitor an optical power of the optical signal. The LD 8 in an anode thereof, which receives a bias Vcc from the outside through an inductor 10a; while, the cathode of the LD 8 couples with the auto-power control (APC) circuit 5 to supply a bias current to the LD 8. The mPD 8 in the anode thereof couples with a resistor 6 that causes a voltage drop by a photocurrent Ipd generated by the mPD 9. The differential LD-Driver 4 in the outputs thereof couple with the anode and the cathode of the LD 9. Thus, the LD 8, the mPD 9, the APC 5, and the differential LD-Driver 4 constitute an optical signal source to generate the optical signal with a preset optical power and the extinction ratio. The embodiment of the present OSA 2 installs both of the LD 8 and the mPD 9. However, the OSA 2 divides the LD 8 and the mPD 9 into respective housings.

The APC 5, which includes a current source 15 comprised of a transistor 11 and a resistor 12, and two differential amplifiers, 13 and 14, determines a bias current $I_B$ supplied to the LD 8. In the transistor 11, the collector couples with the cathode of the LD 8 through the inductor 10b, the base couples the differential amplifier 13 in the base, and the emitted is grounded through a resistor 12. The emitter also couples with the inverting input of the differential amplifier 13 and the controller 7. The non-inverting input of the differential amplifier 14 couples with the controller 7, while, the inverting input thereof detects the voltage drop caused in the resistor 6 by the photocurrent Ipd of the mPD 9. The APC 5 in the differential amplifier thereof amplifies a difference between the target optical power set by the controller 7, which is denoted as $A_{REF}$ in FIG. 1, and the voltage drop caused at the resistor 6 by the photocurrent Ipd; and the other differential amplifier 13 accompanied with the transistor 11 adjusts the bias current $I_B$ to set the output power of the LD 8 to be equal to the target optical power. Thus, the differential amplifier 13 accompanied with the transistor 11 operates as a bias current source.

The differential LD-Driver 4, which receives modulating signals complementary to each other having levels of "1" and "0", provides the modulation current corresponding to this modulating signals to the LD 8. The magnitude of the modulation current $I_M$ is set under the control of the controller 7. Referring to FIG. 2, the differential driver 4 comprises a pair of transistors, 41a and 41b, each of bases thereof receive the modulating signals; two load resistors, 42a and 42b, each set between respective collectors of the transistors, 41a and 41b, and the power supply Vcc; and a current source 43 commonly connected to the emitter of the transistors, 41a and 41b. The outputs of the differential driver 4 are extracted from respective collectors of the transistors, 41a and 41b, and coupled with the LD 8 in the AC mode through capacitors, 45a and 45b. That is, the LD 8 is connected between the outputs of the differential driver 4 in the AC mode through two capacitors, 45a and 45b.

Figure 3A:
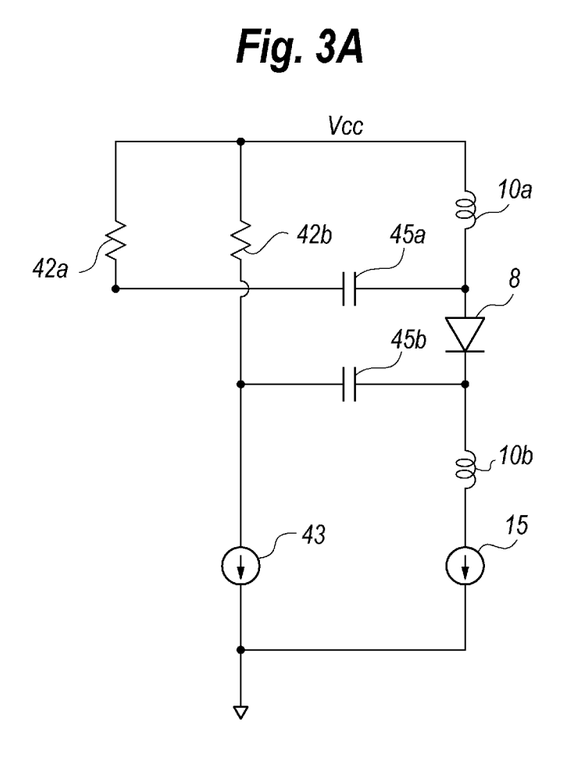
Figure 3B:
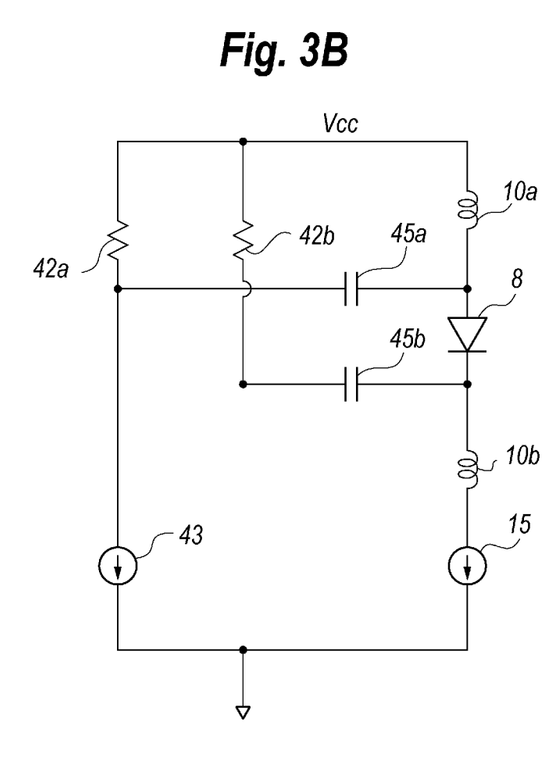
FIG. 3B shows an equivalent circuit of the differential driver when input signal is in HIGH.

Referring to FIGS. 3A and 3B, the operation of the differential driver 4 will be described in detail.

Two transistors, 41a and 41b, in the differential driver 4 operate as switches alternately turned on and off. FIG. 3A is a circuit diagram when the transistor 41a turns off, and the other transistor 41b turns on; while, FIG. 3B shows an equivalent circuit of the differential driver 4 when the former transistor 41a turns on and the latter one turns off. The differential driver 4 provides three current paths from the positive power supply Vcc to the ground, and the current flowed from the power supply Vcc flows into the bias current source 15 and the current source 43 in the differential driver 4. The latter current source 43 is often called as the modulation current source. The LD 8 in the modulation behavior thereof is determined how much current flowing in the LD 8. Although the levels of the outputs of the differential driver 4 slightly fluctuates by switching on/off of the transistors, 41a and 41b; the current flowing out from the power supply Vcc becomes substantially independent of the fluctuation because resistance of the load resistors, 42a and 42b, is set in small.

Under a condition in FIG. 3A, where the transistor 41a is turns off, a current of $I_B+I_m-2\times I'$ flows in the inductor 10a, where IB, IM and I' are the current determined by the current source 15, the bias current, that determined by the current source 43, the modulation current, and that flowing in the load resistors, 42a and 42b. Then, the current $I_H$, which is calculated by $I_H=I_B+I_M-2\times I'=I_B+I_M-I'$, flows in the LD 8, where $I_H$ means the current for HIGH level. That is, a current I' from one of the load resistor 42a added with the current $I_B+I_M-2\times I'$ coming from the inductor 10a is flowing in the LD 8. While, the bias current $I_B$ flows in the other inductor 10b connected in the cathode of the LD 8, and the capacitor 45b passes the rest current, namely, $I_M-I'$. This current $I_M-I'$ is added with the current I' coming from the load resistor 42b to be the modulation current $I_M$.

On the other hand, under another condition shown in FIG. 3B, where the transistor 41a turns on, considering the cathode of the LD 8, the current flowing in the LD 8 added with the current coming from the load resistor 42b becomes the bias current, namely, $I_B=I_L+I'$, $I_L=I_B-I'$, where $I_L$ means the current for LOW level.

Summarizing the analysis above describer, the condition shown in FIG. 3A makes the current flowing in the LD 8 maximum, while, that shown in FIG. 3B makes the current in the LD 8 minimum. In the practical operation of the differential driver 4, HIGH and LOW levels alternately iterate. Then, the bias current $I_B$ gives the average current for the LD 8. That is, the relation $(I_H+I_L)/2=I_B$ is satisfied. Substituting specific currents for HIGH and LOW levels, the following relation is extracted:

$$I'=I_M/2,$$

that is;

$$I_H=I_B+I_M/2$$

$$I_L=I_B-I_M/2.$$

Taking the slight fluctuation of the outputs of the differential driver 4 due to the input differential signal into account, a fine tuning for the bias and modulation currents, $I_B$ and $I_M$, is inevitable. However, the bias current $I_B$ determined by the current source 15, and the modulation current $I_M$ substantially determined by the current source 43 determine the average of the optical output power and the extinction ratio thereof, respectively.

That is, in the differential driving mode for the LD 8, it is hard to define the magnitude of the modulation current to obtain a preset extinction ratio of light output from the LD 8 only by circuit elements, specifically, the resistance, the capacitance, the size of the current source, and so on. A portion of the modulation current is absorbed by the current source 43 after flowing in the LD 8 and the transistors, 45a and 45b, of the differential circuit. However, the current source 43 also absorbs a current coming from the power supply Vcc through the loads, 42a and 42b. Although the resistance of the loads, 42a and 42b, and the operating impedance of the LD 8 determine a contribution of the portion of the modulation current in the current source 43, the latter, namely, the impedance of the LD 8 is well known to be widely scattered.

Moreover, the differential driver 4 shown in FIG. 2 is necessary to adjust two current sources, 43 and 15, to compensate the temperature dependence of performances of the LD 8. Adjustment of two current sources is complex itself; besides, the adjustment taking the temperature dependence of the LD 8 into account becomes further complex.

Conventionally, a correlation of the extinction ratio of light coming from an LD with the modulation current is investigated at three temperatures, for instance, a low temperature of −40° C., a medium one of 25° C., and a high one of 85° C.; and respective modulation currents realizing the target extinction ratio are memorized for practical operation of an LD. It takes long time to check the operation of an LD as varying the ambient temperature. Moreover, necessary performance is not those obtained in a bare LD or in a packaged LD; but those where a packaged LD is installed within a housing of an optical transceiver. In such a case, investigations of the performance of an LD as varying the temperature thereof becomes further nuisance because not only the currents supplied to the LD are not directly measured but the temperature takes a long time until it becomes steady.

Referring back to FIG. 1, the controller 7 provides an analog-to-digital converter 16 (hereafter denoted as A/D-C), two digital-to-analog converters, 17 and 18, (hereafter denoted as D/A-C), a logic unit 19, and storage 20. The A/D-C 16 receives an analog signal $A_B$ caused by the resistor 12 when the bias current $I_B$ flows therein, converts this analog signal $A_B$ into a digital form $D_B$ to provide the logic unit 19. The digital signal $D_B$ will be referred as the measured parameter for the bias current. The first D/A-C 17 converts a digital signal $D_M$, which relates to the amplitude of the modulation current $I_M$ and provided from the logic unit 19, into an analog signal $A_M$ to send the differential driver 4. The parameter $D_M$ will be referred as the setting parameter for the modulation current. The second D/A-C 18 sets the reference $A_{REF}$ that corresponds to the photocurrent Ipd converted by the resistor 6 into a voltage signal.

The logic unit 19 in the controller 19 first fetches a parameter from the storage 20 as receiving the measured parameter for the bias current from the A/D-C 16, which corresponds to the currently flowing bias current $I_B$, determines the setting parameter $D_M$ for the modulation current $I_M$ next set in the differential driver 4 through the D/A-C 17. Specifically, the storage 20 stores two parameters, α and β. The logic unit 19, monitoring the currently flowing bias current $I_B$ received as the measuring parameter $D_B$ through the A/D-C 16, determines the setting parameter $D_M$ next set in the differential driver 4 according to the following relation:

$$D_M = \alpha \times D_B + \beta. \quad (1)$$

Thus, the optical output of the LD 8 not only the average thereof but the extinction ratio may be set in respective target values.

Figure 4:
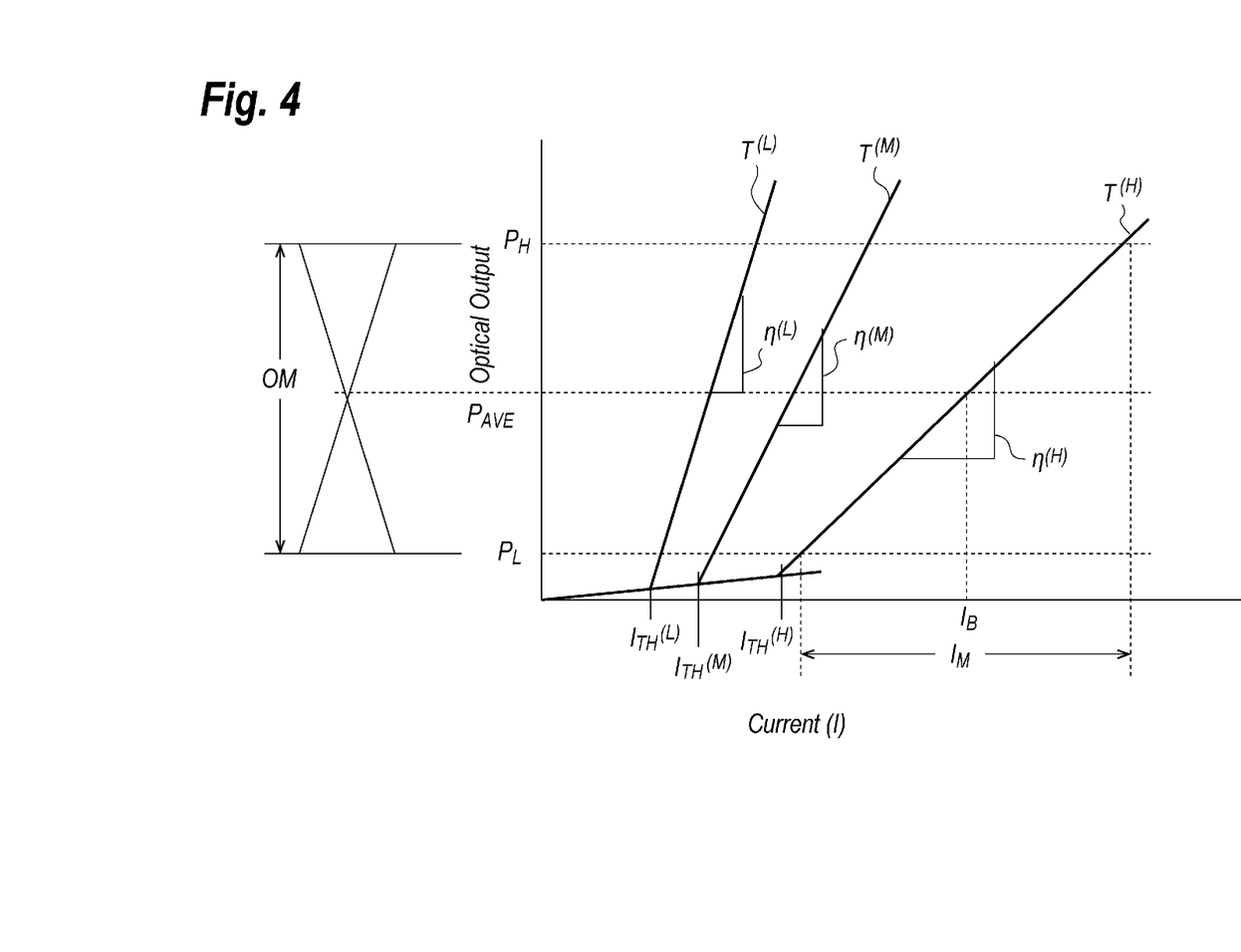
FIG. 4 shows typical current to light characteristics of an LD in various temperatures.

Next, referring to FIG. 4, various parameters of an LD that show temperature dependence will be described. The optical characteristic of an LD may be roughly described by, what is called, the I-L characteristic. The threshold current $I_{TH}$ and the slope efficiency η determine the I-L characteristic. Furthermore, these two parameters, $I_{TH}$ and η, show large temperature dependence. On the other hand, an apparatus implementing with an LD often specifies the average output power $P_{AVE}$, the optical amplitude OM and the extinction ratio ER as:

$$P_{AVE} = (P_H + P_L)/2,$$

$$OM = P_H - P_L, \text{ and}$$

$$ER = P_H/P_L,$$

where $P_H$ and $P_L$ are the maximum and the minimum of the optical output.

From the equations above, the following are automatically derived:

$$P_H = OM \times ER/(ER-1),$$

$$P_L = OM/(ER-1), \text{ and}$$

$$P_{AVE} = \{OM \times (ER+1)/(ER-1)\}/2$$

On the other hand, from the I-L characteristic as far as the operation of the LD is in the linear region thereof;

$$P_{AVE} = \eta \times (I_B - I_{TH}), \text{ and}$$

$$OM = \eta \times I_M;$$

are satisfied. Then, $$P_{AVE} = \eta \times (I_B - I_{TH}) \times \{OM \times (ER+1)/(ER-1)\}/2, \text{ namely,}$$

$$\eta \times (I_B - I_{TH}) = \{\eta \times I_M \times (ER+1)/(ER-1)\}/2.$$

Moreover, $$I_M = (I_B - I_{TH}) \times 2 \times (ER-1)/(ER+1) = (I_B - I_{TH}) \times M, \text{ and}$$

$$M = 2 \times (ER-1)/(ER+1),$$

are satisfied, where M is given by $M = I_M/(I_B - I_{TH})$, which ideally becomes 2. The average $P_{AVE}$ is given by the mean value of $P_H$ ($= I_B + I_M/2$) and $P_L$ ($= I_B - I_M/2$), but slightly deviates from the mean value in ordinary conditions. Moreover, the average also shifts depending on temperatures.

Figure 7:
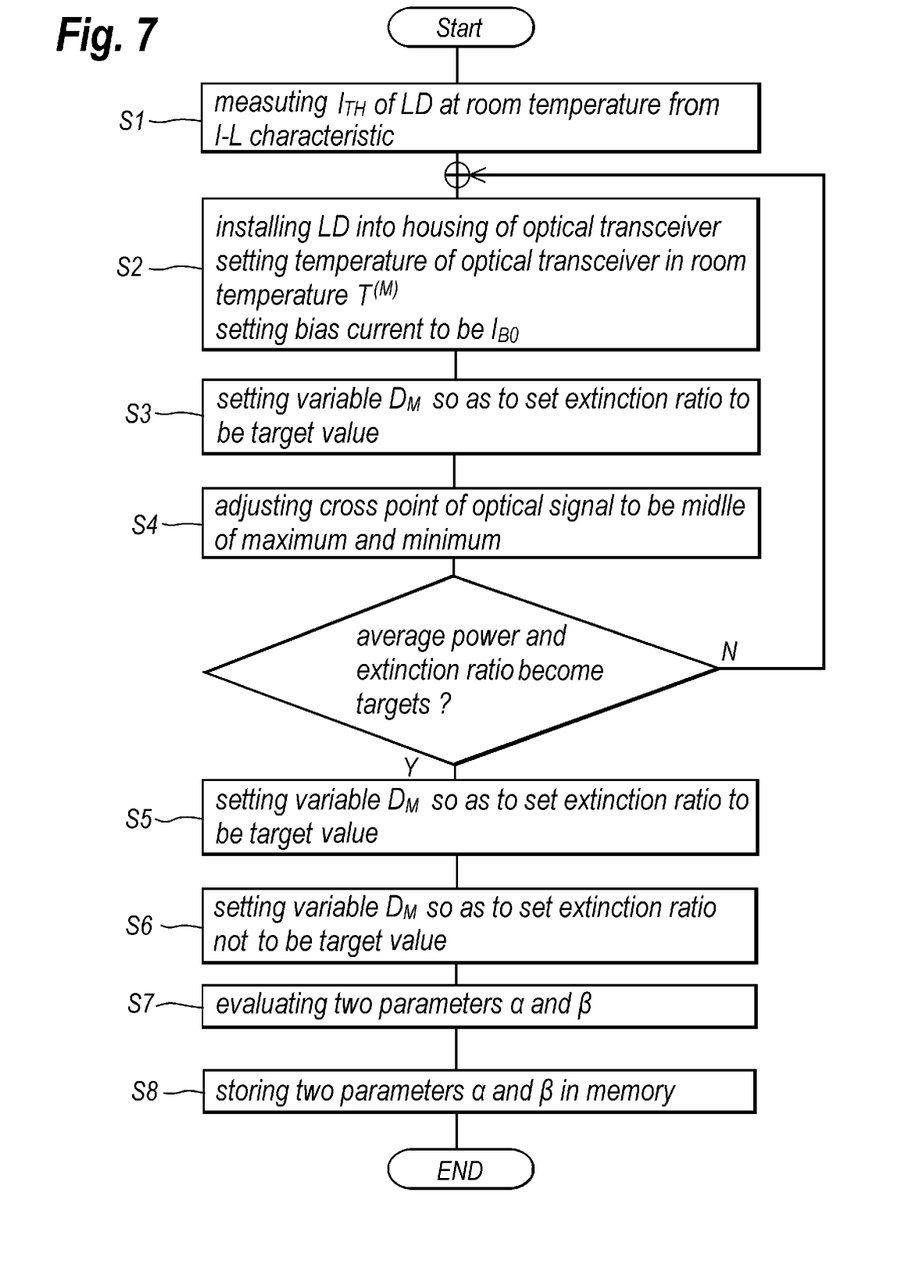
FIG. 7 shows a flow chart to determine parameters that correlate the measured bias current with the adjustable modulation current.

Next, a method to obtain two parameters, α and β, which correlate the measured value $D_B$ for the bias current with the setting value $D_M$ for the modulation current, and a method to assembly an optical transceiver 1 will be described in detail as referring to FIG. 7.

First at step S1, the I-L characteristic is measured under at least one temperature, for instance, at a room temperature $T^{(M)} = 25°$ C., for an LD installed in a package of the OSA 2 but the OSA 2 is not installed within the housing of the optical transceiver 1. The I-L characteristic thus measured gives the threshold current at the room temperature $I_{TH}(T^{(M)})$.

Next, at step S2, installing the OSA 2 into the housing of the optical transceiver 1 and setting an ambient temperature of the optical transceiver 1 to be in the room temperature $T^{(M)}$; the bias current of the LD is set to be $I_{B0}$ such that light output from the optical transceiver 1 in an average thereof becomes the target power. In this step S2, the bias current $I_{B0}$ is obtained by varying the a value set in the second D/A-C 18 manually as killing the APC 5. In this step S2, the precise control of the target value is unnecessary.

The digital value $D_M$ to be set in the first D/A-C 17 is also adjusted under the room temperature $T^{(M)}$ such that the extinction ratio of the light output from the optical transceiver 1 becomes the target $ER_1$, at step S3. The optical signal output from the optical transceiver 1 is practically monitored and the extinction ratio thereof is measured as varying the setting parameter $D_M$ set in the second D/C-C 17. At step S3, the maximum $P_H$ and the minimum $P_L$ of the light output form the optical transceiver 1, and the ratio thereof are fixed; but the quality of the light output from the optical transceiver 1, such as the signal shape and the average of the optical output, are not always set in respective targets.

Next, the cross point of the light output from the optical transceiver 1 is set in the middle 50% of the maximum and the minimum thereof by adjusting the offset of differential signals input to the differential driver 4, at step S4. This adjustment makes the average power of the light output from the optical transceiver 1 to be the target value $P_{AVE}$. This means that, when the mark ratio of the signal input to the differential driver 4 is 50%, the cross point of the optical output becomes the average thereof. Steps from S2 to S4 are iterated until the average power and the extinction ratio of the optical signal output from the optical transceiver 1 become respective target values. The setting value $D_M$ set in the first D/A-C 17 and that set in the second D/A-C 18 are stored in the memory 20 at step S5.

In a conventional algorithm, steps from S1 to S5 are carried out under at least three temperatures, $T^{(L)}$, $T^{(M)}$, and $T^{(H)}$ to obtain behaviors of the bias current $I_B$ and the modulation current $I_M$ against temperatures to create a look-up-table (LUT). Thus, the LUT holds a relation of the modulation current $I_M$ against the bias current $I_B$. Points except for practically measured three points are estimated by the curve approximation.

The bias current $I_B$ to get the average power depends on the temperature. Conventionally, the bias current is automatically controlled by the APC so as to get the average power; while, the modulation current $I_M$ is obtained by referring to the LUT based on thus determined bias current $I_B$. A set of the bias current $I_B$ and the modulation current $I_M$ is determined to set the average power and the extinction ratio in respective target values independent of the temperature.

The method according to an embodiment of the invention assumes following parameters to relate the setting parameter $D_M$ to be set in the first D/A-C 17 to the practical modulation current $I_M$ supplied to the LD, that is:

$$I_M = a \times D_M + b,$$

where a and b are constant. According to an ordinary operation of a D/A-C, the output voltage/current thereof shows a linear dependence with respect to the input digital value. When an operating point of an LD on the I-L characteristic shown in FIG. 4 is in a region where the slope efficiency η is constant, the extinction ratio of the output light becomes linear to the modulation current. However, even the extinction ratio and the modulation current makes a liner relation, details of the linearity, namely, two parameters, a and b, in the above equation is not always universal, rather randomly scattered between LDs. The method according to the embodiment determines two parameters, a and b, as follows:

First, as the temperature of optical transceiver 1 is kept in the room temperature $T^{(M)}$, the bias current $I_B$ is set to be $I_{B0}$ which is obtained in steps S2 to S5; and the setting parameter $D_M$ for the modulation current $I_M$ is set to be $DM_2$, which is different from the former setting parameter $DM_1$ at which the target extinction ratio is obtained. Under these conditions for the currents, $I_{B0}$ and $I_{M1}$, the extinction ratio of the light output from the optical transceiver 1 is measured at step S6.

Figure 5:
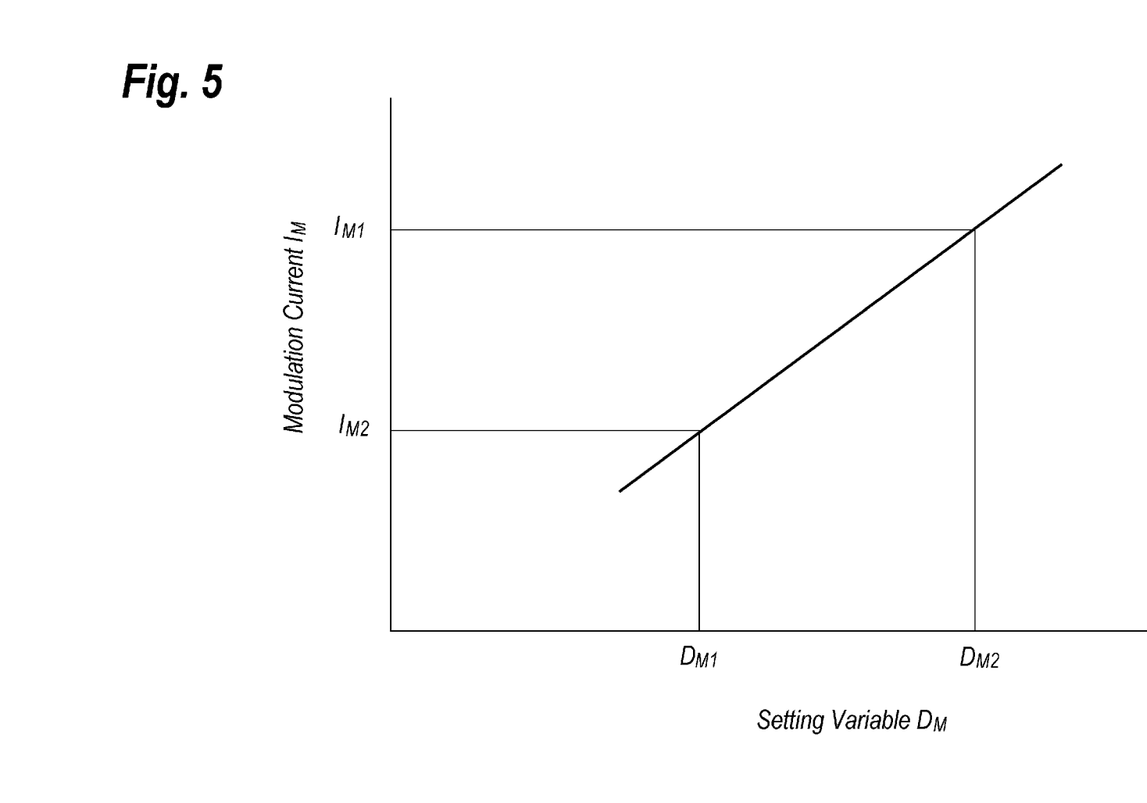
FIG. 5 shows a general relation between the setting parameter $D_M$ for the modulation current and the practical modulation current $I_M$.

Then, two parameters, a and b, in the above equation is evaluated based on that shown in FIG. 5 as follows:

$$a = (I_{M1} - I_{M2})/(D_{M1} - D_{M2}), \text{ and}$$

$$b = (I_{M1} \times D_{M2} + I_{M2} \times D_{M1})/(D_{M1} - D_{M2}).$$

Because the OSA 2 is already installed within the housing of the optical transceiver 1, the bias current $I_B$ and the modulation current $I_M$ are not directly detected. However, the extinction ratio of the light output from the transceiver 1 brings the information about the bias current $I_B$. Specifically, from the relation between the modulation current $I_M$ and the extinction ratio ER, the followings are given;

$$I_{M1} = (I_B - I_{TH}) \times M_1, \text{ and}$$

$$I_{M2} = (I_B - I_{TH}) \times M_2;$$

where, $$M_1 = 2 \times (ER_1 - 1)/(ER_1 + 1), \text{ and}$$

$$M_2 = 2 \times (ER_2 - 1)/(ER_2 + 1).$$

Then, two parameters, a and b, above described are:

$$a = (M_1 - M_2) \times (I_B - I_{TH})/(D_{M1} - D_{M2}) \text{ and}$$

$$b = (-M_1 \times D_{M2} + M_2 \times D_{M1}) \times (I_B - I_{TH})/(D_{M1} - D_{M2}).$$

The bias current $I_B$ is generalized by introducing a factor c, namely, $$I_B = c \times I_{B0},$$

where $I_{B0}$ is the bias current first obtained manually not by the APC 5.

The method of the embodiment finally correlates the measured digital parameter $D_B$ for the bias current $I_B$ with the setting digital parameter $D_M$ for the modulation current $I_M$, which is generally denoted by the linear equation (1) above explained:

$$D_M = \alpha \times I_B/c + \beta$$

$$(I_M - b)/a = \alpha \times I_B/c + \beta$$

$$I_M = a \times \alpha \times I_B/c + a \times \beta + b, \text{ namely,}$$

$$I_M/\{I_B + (c/a\alpha) \times (a\beta + b)\} = a\alpha/c.$$

Comparing the equation above with an equation that correlates the modulation current $I_M$ with the extinction ratio M:

$$I_M = (I_B - I_{TH}) \times M, \text{ namely,}$$

$$I_M/(I_B - I_{TH}) = M;$$

we obtain, at step S7, the series of relations below:

$$M_N = 2 \times (ER_N - 1)/(ER_N + 1), (N=1, 2) \quad (2)$$

$$a = (M_1 - M_2) \times (c \times I_{B0} - I_{TH})/(D_{M1} - D_{M2}) \quad (3)$$

$$M = a\alpha/c$$

$$\alpha = cM_1/a \quad (4)$$

$$\beta = D_{M1} - \alpha \times I_{B0} \quad (5)$$

Two parameters, α and β, are to be stored in the storage 20 at step S8.

In a practical operation of the optical transceiver 1, the bias current $I_B$ is automatically set so as to become the average power of the light output from the optical transceiver 1 in the target value by the APC 5, and the bias current $I_B$ currently flowing in the LD 8 is evaluated through the measured parameter $D_B$. Fetching two parameters, α and β, from the storage 20 and calculating the setting parameter $D_M$ from the measured parameter $D_B$ and these two parameters, α and β, this setting parameter $D_M$ is set in the differential driver 4 through the first D/A-C 17 to keep the extinction ratio of the optical signal output from the optical transceiver 1.

The method to control an LD and to assembly an optical transceiver 1 implemented with the LD thus described evaluates two parameters, α and β, from variables measured for the optical transceiver 1 under only one temperature, for instance, the room temperature $T^{(M)}$, even if an LD shows large temperature dependence in performances thereof, where two parameters correlate the measured parameter $D_B$ for the bias current $I_B$ with the setting parameter $D_M$ for the modulation current $I_M$. That is, two parameters, α and β, are estimated from a threshold current $I_{TH}$ measured in the OSA not installed within the housing of the optical transceiver 1 under the one temperature; the fundamental bias current $I_{B0}$ also measured under the one temperature for roughly obtaining the target average power; and two setting variables $D_{MN}$ (N=1, 2) and the extinction ratios $ER_N$ (N=1, 2) measured for the light output from the optical transceiver 1. Thus, the production of the optical transceiver 1, in particular, the inspection of the performance of the optical transceiver 1 depending on the temperature becomes in facilitated.

The bias current $I_B$ is automatically adjusted by the APC circuit 5 independent of the temperature, and a bias current presently supplied to the LD 8 is monitored through the measured parameter $D_B$. As for the modulation current $I_M$, the control or the adjustment thereof becomes simple if the current determined by the setting parameter $D_M$ fully flows in the LD and reflected in the extinction ratio. However, in the differential driver 4, the current set by the current source 43, which is controlled by the setting parameter $D_M$ from the controller 7, does not fully flow in the LD 8. Accordingly, a practical comparison between the setting parameter $D_M$ for the modulation current $I_M$ and the extinction ratio ER is necessary. The method according to the present embodiment simplifies this inspection of the extinction ratio against the modulation current.

Figure 6:
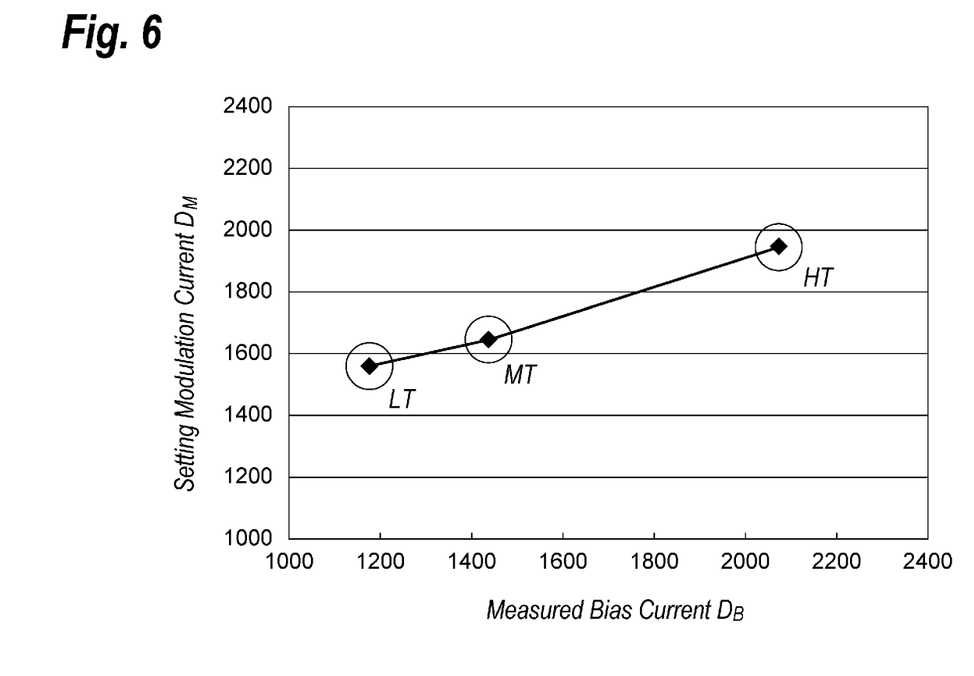
FIG. 6 shows a relation between the measured parameter of the bias current $D_B$ and the setting parameter for the modulation current $D_M$.

FIG. 6 shows a relation of the measured value $D_B$ for the bias current $I_B$ against the setting parameter $D_M$ for the modulation current $I_M$ practically measured at three temperatures, high temperature HT, medium temperature MT and low temperature LT. A behavior shown in FIG. 6 was evaluated by carrying out steps from S2 to S4 and S5. As shown in FIG. 6, the setting parameter $D_M$ for the modulation current $I_M$ shows a linear relation with respect to the measured parameter $D_B$ for the bias current $I_B$ including the temperature dependence thereof, where two parameters set the average power and the extinction ratio in respective target values.

Moreover, the method of the embodiment thus described measures the threshold current $I_{TH}$ of the LD in the arrangement of the OSA 2 before the OSA 2 is installed within the housing of the optical transceiver 1, which further simplifies the inspection of the optical transceiver 1. Thus, the embodiment to control the operation of an LD, or to produce an optical transceiver implementing with an LD is performed.

While a particular embodiment of the present invention has been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method to drive a semiconductor laser diode (LD) installed in an apparatus by providing signals complementary to each other to a cathode and an anode thereof differentially from a differential driver, the LD being supplied with a bias current directly and a modulation current indirectly through the differential driver, the method comprising steps of:

obtaining two parameters that correlates the modulation current with respect to the bias current in a linear equation denoted as:

$$I_M = \alpha \times I_B + \beta,$$

where $I_M$ is the modulation current, $I_B$ is the bias current, and $\alpha$ and $\beta$ are the two parameters;

setting the bias current by an auto-power control (APC) such that the apparatus outputs light with a target average power; and determining the modulation current by referring to the two parameters.

2. The method of claim 1, wherein the driver includes a current source to determine a current a portion of which is converted into the modulation current; and wherein the step of obtaining the two parameters includes steps of:

obtaining a threshold current of the LD from a current-to-light characteristic of the LD not installed in the apparatus;

obtaining a basic bias current of the LD so as to set an average power of light output from the apparatus in a target power manually not using the APC; and obtaining a relation between the extinction ratio of the light output from the apparatus and a current determined by the current source in the differential driver, wherein the two parameters are given by:

$$\alpha = c \times M_1/a,$$

$$\beta = D_{M1} - \alpha \times I_{B0},$$

$$a = (M_1 - M_2) \times (c \times I_{B0} - I_{TH})/(D_{M1} - D_{M2}),$$

$$M_N = 2 \times (ER_N - 1)/(ER_N + 1), \text{ and}$$

$$c = I_B/I_{B0};$$

where $ER_N$ and $D_{MN}$ are the extinction ratio and the current determined by the current source, respectively; $I_{TH}$ and $I_{B0}$ are the threshold current and the basic bias current, respectively.

3. The method of claim 2, wherein the current provided from the current source is digitally set through a digital-to-analog converter by the parameter $D_{MN}$.

4. A method to manufacture an optical transceiver implemented with an optical sub-assembly (OSA) having a semiconductor laser diode (LD) therein, the LD in the optical transceiver being driven by a differential driver to provide signals complementary to each other to the LD, the LD outputting an optical signal whose average power is controlled by a bias current determined by an auto-power control (APC) circuit and an extinction ratio is adjusted by a modulation current provided from the differential driver, the differentia driver including a current source to generate a current, a portion of the current converting into the modulation current, the method comprising steps of:

measuring a threshold current of the LD under at least one temperature by monitoring a signal output from the OSA;

installing the OSA within the optical transceiver;

evaluating a basic bias current of the LD so as to set the average power of the optical signal output from the optical transceiver in a target power manually not using the APC circuit;

varying a current provided from the differential driver in at least two levels to vary the extinction ratio of an optical signal output from the optical transceiver as the optical signal shows the target average power by adjusting the bias current by the APC circuit under the at least one temperature; and evaluating two parameters to correlate the modulation current in linear with the bias current independent of temperatures.

5. The method of claim 4, wherein the linear relation of the modulation current against the bias current is denoted as:

$$I_M = \alpha \times I_B + \beta,$$

where $I_M$ and $I_B$ are the modulation current and the bias current, respectively, and $\alpha$ and $\beta$ are the evaluated two parameters.

6. The method of claim 5, further comprising a step of storing the evaluated two parameters in a memory.

7. The method of claim 4, wherein the evaluation of two parameters are performed by equations of:

$$\alpha = c \times M_1/a, \text{ and}$$

$$\beta = D_{M1} - \alpha \times I_{B0};$$

where a and $M_N$ are denoted as:

$$a = (M_1 - M_2) \times (c \times I_{B0} - I_{TH})/(D_{M1} - D_{M2})$$

$$M_N = 2 \times (ER_N - 1)/(ER_N + 1), \text{ and}$$

$$c = I_B/I_{B0},$$

where $D_{M1}$ and $D_{M2}$ are the currents varied in two levels and provided by the differential driver, and $ER_1$ and $ER_2$ are the extinction ratios varied in two levels, $I_{TH}$ is the threshold current measured in the OSA, $I_{B0}$ is the basic bias current.

8. The method of claim 7,
wherein the bias current is digitally measured and the current of the current source in the differential driver is digitally set.

* * * * *